US011342292B2

(12) United States Patent
Liu (10) Patent No.: US 11,342,292 B2
(45) Date of Patent: May 24, 2022

(54) BONDING PAD STRUCTURE FOR MEMORY DEVICE AND METHOD OF MANUFACTURING THE SAME

(71) Applicant: Changxin Memory Technologies, Inc., Anhui (CN)

(72) Inventor: Chih Cheng Liu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/015,223

(22) Filed: Sep. 9, 2020

(65) Prior Publication Data
US 2020/0411457 A1 Dec. 31, 2020

Related U.S. Application Data (63) Continuation of application No. PCT/CN2019/082454, filed on Apr. 12, 2019.

(30) Foreign Application Priority Data

Apr. 13, 2018 (CN) .......................... 201810328852.1

(51) Int. Cl.
*H01L 21/768* (2006.01)
*H01L 23/522* (2006.01)
*H01L 23/00* (2006.01)

(52) U.S. Cl.
CPC .............. *H01L 24/05* (2013.01); *H01L 24/03* (2013.01); *H01L 2224/0345* (2013.01);
(Continued)

(58) Field of Classification Search
CPC ......... H01L 24/12; H01L 24/05; H01L 33/38; H01L 2224/14
See application file for complete search history.

(56) References Cited

U.S. PATENT DOCUMENTS

| 6,455,943 | B1* | 9/2002 | Sheu | ....................... H01L 24/05 257/758 |
| 2002/0102793 | A1* | 8/2002 | Wu | .................... H01L 27/11526 438/257 |
| 2002/0115280 | A1 | 8/2002 | Lin et al. | |

FOREIGN PATENT DOCUMENTS

| CN | 1379466 A | 11/2002 |
| CN | 108346636 A | 7/2018 |
| TW | 463306 B | 11/2001 |

OTHER PUBLICATIONS

PCT International Search Report and the Written Opinion dated Jul. 10, 2019, issued in related International Application No. PCT/CN2019/082454 (7 pages).

* cited by examiner

*Primary Examiner* — Hoa B Trinh
(74) *Attorney, Agent, or Firm* — Sheppard Mullin Richter & Hampton LLP (57) ABSTRACT

A bonding pad structure and a method thereof includes: a base metal layer formed on a substrate; first conductive vias arranged in a peripheral region of the base metal layer; an intermediate buffer layer formed above the base metal layer, the intermediate buffer layer spaced from and aligned with the base metal layer, the first conductive vias vertically connecting the base metal layer and the intermediate buffer layer; second conductive vias arranged in a peripheral region of the intermediate buffer layer; a surface bonding layer formed above the intermediate buffer layer, the surface bonding layer spaced from and aligned with the intermediate buffer layer, the second conductive vias vertically connecting the intermediate buffer layer and the surface bonding layer, the intermediate buffer layer comprising a mesh structure, and the first conductive vias and the second (Continued)

conductive vias not vertically aligned with a central region of the intermediate buffer layer.

14 Claims, 4 Drawing Sheets

(52) U.S. Cl.
CPC ............... *H01L 2224/03452* (2013.01); *H01L 2224/05013* (2013.01); *H01L 2224/05083* (2013.01); *H01L 2224/05095* (2013.01); *H01L 2224/05098* (2013.01); *H01L 2224/05124* (2013.01); *H01L 2224/05139* (2013.01); *H01L 2224/05144* (2013.01); *H01L 2224/05147* (2013.01); *H01L 2224/05169* (2013.01); *H01L 2924/1436* (2013.01); *H01L 2924/1437* (2013.01)

BONDING PAD STRUCTURE FOR MEMORY DEVICE AND METHOD OF MANUFACTURING THE SAME

CROSS-REFERENCE TO RELATED APPLICATIONS

This application is a continuation application of International Patent Application No. PCT/CN2019/082454, filed on Apr. 12, 2019, which is based on and claims priority of Chinese Patent Application No. 201810328852.1, filed with the State Intellectual Property Office (SIPO) of the People's Republic of China on Apr. 13, 2018. The above-referenced applications are incorporated herein by reference in their entirety.

TECHNICAL FIELD

The present invention relates to the field of semiconductor memory devices and, in particular, to a bonding pad structure for a memory device and a method of manufacturing the same.

BACKGROUND

During the fabrication of a memory device such as a Dynamic Random Access Memory (DRAM) device, a conventional pad bonding process typically involves interconnecting two or more conductor layers with array(s) of vertical vias. The via is usually filled with a hard metal stick (e.g., a tungsten plug structure, which is often considered part of the via), and the bonding stress is often not released during the bonding of the upper conductor layer, and sometime causes damage to the vias.

SUMMARY

It is an objective of the present invention to provide a bonding pad structure for a memory device and a method of manufacturing the same.

In order to achieve this objective, in one aspect of the present invention, there is provided a bonding pad structure for a memory device, comprising: a base metal layer formed on a substrate; a plurality of first conductive vias arranged in a peripheral region of the base metal layer; an intermediate buffer layer formed above the base metal layer, wherein the intermediate buffer layer is spaced from and aligned with the base metal layer, and the plurality of first conductive vias are vertically connecting the base metal layer and the intermediate buffer layer; a plurality of second conductive vias arranged in a peripheral region of the intermediate buffer layer; and a surface bonding layer formed above the intermediate buffer layer, wherein the surface bonding layer is spaced from and aligned with the intermediate buffer layer, and the plurality of second conductive vias are vertically connecting the intermediate buffer layer and the surface bonding layer, wherein the intermediate buffer layer comprises a mesh structure, and the plurality of first conductive vias and the plurality of second conductive vias are not vertically aligned with a central region of the intermediate buffer layer.

Optionally, the central region of the intermediate buffer layer comprises a hollow region, and the mesh structure is formed in the peripheral region of the intermediate buffer layer.

Optionally, the mesh structure in the peripheral region of the intermediate buffer layer comprises rectangular slots.

Optionally, each of the rectangular slots has a length/width ratio ranging from 3 to 10.

Optionally, the hollow region of the central region of the intermediate buffer layer occupies 20% to 60% of a total area of the intermediate buffer layer.

Optionally, the bonding pad structure may further comprise: a first dielectric layer between the base metal layer and the intermediate buffer layer, the first dielectric layer having a plurality of first openings formed therein, the plurality of first conductive vias formed in the plurality of first openings; and a second dielectric layer between the intermediate buffer layer and the surface bonding layer, the second dielectric layer having a plurality of second openings formed therein, the plurality of second conductive vias formed in the plurality of second openings.

Optionally, the plurality of first conductive vias comprises three to five rows of first conductive vias within the peripheral region of the base metal layer.

Optionally, the plurality of second conductive vias comprises three to five rows of second conductive vias within the peripheral region of the intermediate buffer layer.

In another aspect of the present invention, there is provided a method of manufacturing a bonding pad structure for a memory device, comprising: providing a substrate; forming a base metal layer on the substrate; arranging a plurality of first conductive vias in a peripheral region of the base metal layer; disposing an intermediate buffer layer above the base metal layer, wherein the intermediate buffer layer is spaced from and aligned with the base metal layer, and the plurality of first conductive vias vertically connects the base metal layer and the intermediate buffer layer; arranging a plurality of second conductive vias in a peripheral region of the intermediate buffer layer; and disposing a surface bonding layer above the intermediate buffer layer, wherein the surface bonding layer is spaced from and aligned with the intermediate buffer layer, and the plurality of second conductive vias vertically connects the intermediate buffer layer and the surface bonding layer, wherein the intermediate buffer layer comprises a mesh structure, the first and second conductive vias are not vertically aligned with a central region of the intermediate buffer layer.

Optionally, the central region of the intermediate buffer layer comprises a hollow region, and the mesh structure is formed in the peripheral region of the intermediate buffer layer.

Optionally, the mesh structure in the peripheral region of the intermediate buffer layer comprises rectangular slots.

Optionally, each of the rectangular slots has a length/width ratio ranging from 3 to 10.

Optionally, the hollow region of the central region of the intermediate buffer layer occupies 20% to 60% of a total area of the intermediate buffer layer.

Optionally, the method may further comprise: forming a first dielectric layer between the base metal layer and the intermediate buffer layer; forming a plurality of first openings in the first dielectric layer, in which the first conductive vias are formed; forming a second dielectric layer between the intermediate buffer layer and the surface bonding layer; and forming a plurality of second openings in the second dielectric layer, in which the second conductive vias are formed.

Optionally, the plurality of first conductive vias comprises three to five rows of first conductive vias within the peripheral region of the base metal layer.

Optionally, the plurality of second conductive vias comprises three to five rows of second conductive vias within the peripheral region of the intermediate buffer layer.

According to the above technical solution, none of the conductive vias is located on the central region of the intermediate buffer layer and the surface bonding layer. When the surface bonding layer is stressed during the bonding process, the intermediate buffer layer and the surface bonding layer may deform toward the central region as there is no "rigid" support from conductive vias on the central region, and the bonding stress can be better released.

Other features and advantages of the present invention will be described in detail in the following description.

BRIEF DESCRIPTION OF THE DRAWINGS

The accompanying drawings, which constitute a part of this specification, are presented to illustrate and facilitate the understanding of the present invention, together with the following description of specific embodiments, rather than to limit the present invention in any sense. In the figures.

LIST OF REFERENCE NUMERALS 100 bonding pad structure
110 substrate
120 base metal layer
121 first conductive vias
122 first dielectric layer
130 intermediate buffer layer
131 second conductive vias
132 second dielectric layer
133 hollow region
140 surface bonding layer
150 slots

DETAIL DESCRIPTION OF THE EMBODIMENTS

Specific embodiments of the present invention are described in detail below with reference to the accompanying drawings. It is to be understood that the specific embodiments described herein are intended to be illustrative but not restrictive.

In general, directional terms such as "upper/above", "lower/under", "left" and "right" are used herein with reference to the orientation shown in the figures, unless indicated to the contrary. In addition, the terms "inside" and "outside", when referring to any component, are used generally with respect to the outline of the component.

The shapes shown in the figures may vary depending on manufacturing techniques and/or tolerances. Therefore, exemplary embodiments of the present invention are not limited to the particular shapes illustrated herein but may include deviations in shapes that result from manufacturing. Additionally, the various elements and regions illustrated in the figures are schematic in nature, and the present invention is not limited to the shown relative dimensions or distances.

Figure 1A:
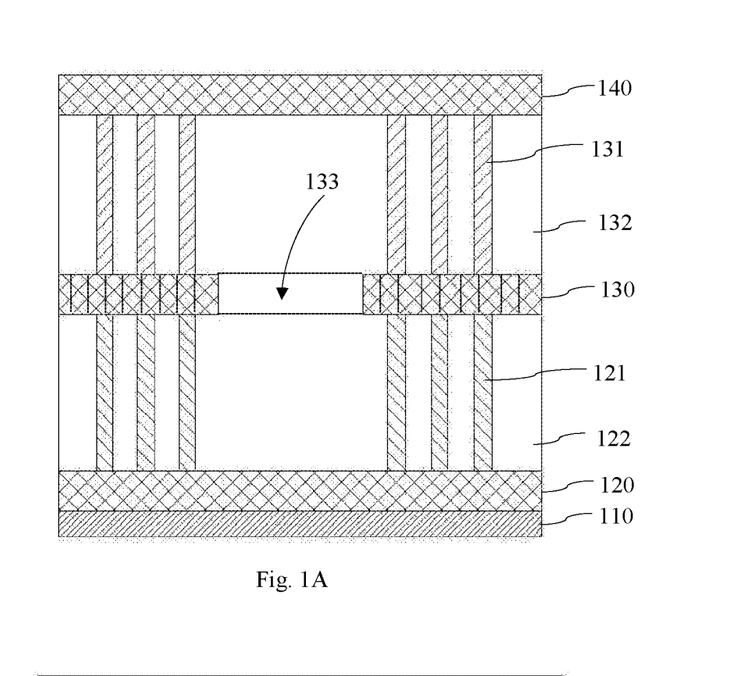
FIG. 1A is a schematic of a cross-sectional view of a bonding pad structure for a memory device according to some embodiments of the present invention.
Figure 1B:
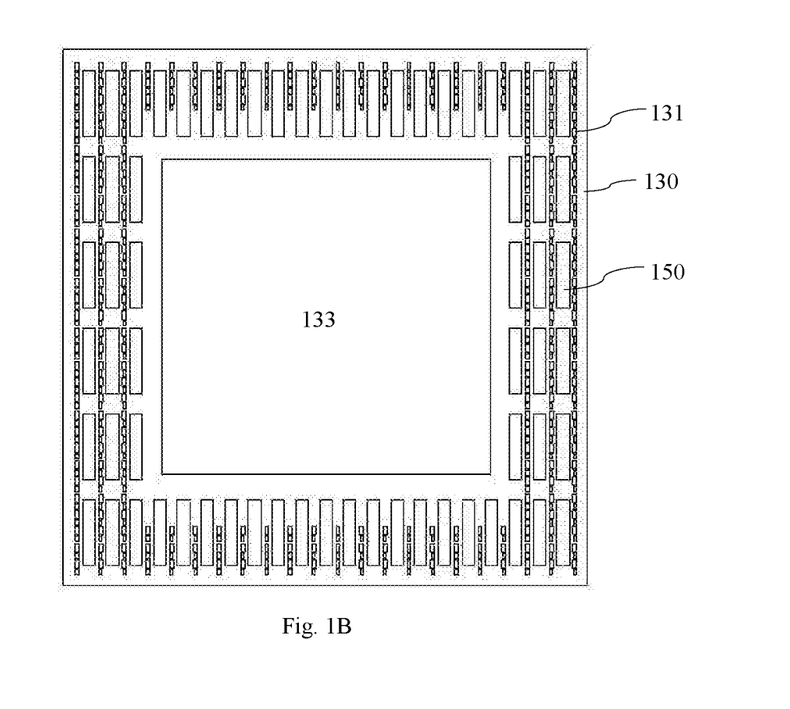
FIG. 1B is a schematic of a top view of an intermediate buffer layer in the bonding pad structure of FIG. 1A.
Figure 1C:
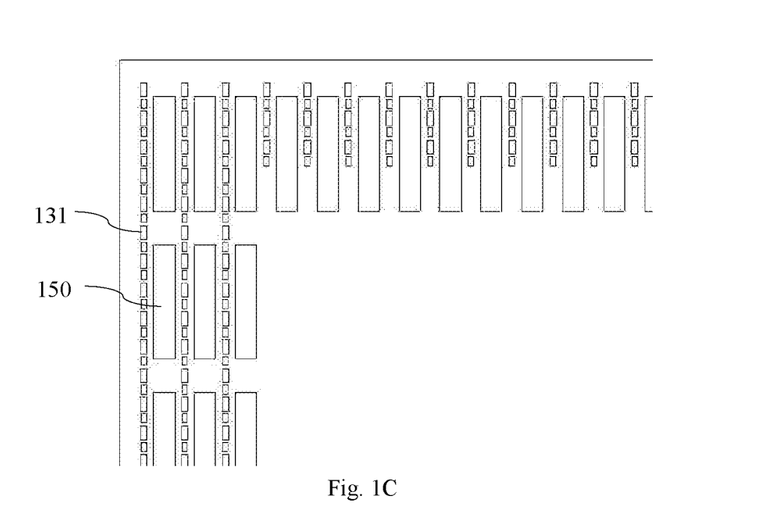
FIG. 1C shows an enlarged view of a portion of the intermediate buffer layer of FIG. 1B.

FIG. 1A is a schematic of a cross-sectional view of a bonding pad structure for a memory device according to some embodiments of the present invention. FIG. 1B is a schematic of a top view of the intermediate buffer layer in the bonding pad structure of FIG. 1A. FIG. 1C shows an enlarged view of a portion of the intermediate buffer layer of FIG. 1B. A person skilled in the art will appreciate that the graphic representations shown in FIGS. 1A to 1C are merely illustrative without being necessarily drawn to full scale and do not limit the bonding pad structure according to the embodiments of the present invention. With reference to FIGS. 1A to 1C, the bonding pad structure 100 may include: a base metal layer 120 formed on a substrate 110, the base metal layer 120 having a peripheral region in which a plurality of first conductive vias 121 may be arranged; an intermediate buffer layer 130 which may be spaced apart from, aligned with and situated above the base metal layer 120, wherein the first conductive vias 121 may vertically connect the base metal layer 120 to the intermediate buffer layer 130; a plurality of second conductive vias 131, which may be arranged in a peripheral region of the intermediate buffer layer 130; and a surface bonding layer 140, which may be spaced apart from and aligned with the intermediate buffer layer 130, wherein the second conductive vias 131 may vertically connect the intermediate buffer layer 130 to the surface bonding layer 140.

The base metal layer 120 may be formed of a material including, but not limited to, gold, silver, copper, platinum or aluminum. In a preferred embodiment of the present invention, the material of the base metal layer 120 may include copper or aluminum. The base metal layer 120 may be formed on the substrate 110 using a conventional technique adopted in the fabrication of memory devices, which is known in the art and therefore will not be described further.

The intermediate buffer layer 130 may be formed of a material including, but not limited to, gold, silver, copper, platinum or aluminum. In a preferred embodiment of the present invention, the material of the intermediate buffer layer 130 may include copper or aluminum. The intermediate buffer layer 130 may be formed using a conventional technique adopted in the fabrication of memory devices. For example, the intermediate buffer layer 130 may be formed by deposition. The deposition may be implemented as, but is not limited to, vacuum evaporation, sputter deposition or chemical vapor deposition (CVD).

A first dielectric layer 122 may be formed between the base metal layer 120 and the intermediate buffer layer 130. In particular, the first dielectric layer 122 may be deposited on the base metal layer 120, and the intermediate buffer layer 130 may be deposited on the first dielectric layer 122. The first dielectric layer 122 may be formed of a material including, but not limited to, an oxide or silicon nitride, or formed of a polymer thin film such as benzocyclobutene (BCB), polyimide (PI) or the like.

The first dielectric layer 122 may have a plurality of first openings. The first conductive vias 121 may be formed in the first openings. In particular, the first openings may be formed in the first dielectric layer 122 by photolithography and etching processes to expose the underlying base metal layer 120 before the intermediate buffer layer 130 is deposited. The first conductive vias 121 may be formed by depositing a conductive material in the first openings. The conductive material may include, but is not limited to, aluminum, copper or tungsten. Preferably, the conductive material may comprise tungsten. Subsequent to the formation of the first conductive vias 121, the intermediate buffer layer 130 may be deposited on the first dielectric layer 122 so that the base metal layer 120 is electrically connected to the intermediate buffer layer 130 by the first conductive vias 121.

The surface bonding layer 140 may be formed of a material including, but not limited to, gold, silver, copper, platinum or aluminum. In a preferred embodiment of the present invention, the material of the surface bonding layer 140 may include copper or aluminum. The surface bonding layer 140 may be formed using a conventional technique adopted in the fabrication of memory devices. For example, the surface bonding layer 140 may be formed by deposition. The deposition may be implemented as, but is not limited to, vacuum evaporation, sputter deposition or chemical vapor deposition (CVD).

In one embodiment of the present invention, the material of the intermediate buffer layer 130 may include aluminum, while that of the surface bonding layer 140 may include copper.

A second dielectric layer 132 may be formed between the intermediate buffer layer 130 and the surface bonding layer 140. In particular, the second dielectric layer 132 may be deposited on the intermediate buffer layer 130, and the surface bonding layer 140 may be deposited on the second dielectric layer 132. The second dielectric layer 132 may be formed of a material including, but not limited to, an oxide or silicon nitride, or formed of a polymer thin film such as benzocyclobutene (BCB), polyimide (PI) or the like.

The second dielectric layer 132 may have a plurality of second openings. The second conductive vias 131 may be formed in the second openings. In particular, the second openings may be formed in the second dielectric layer 132 by photolithography and etching processes to expose the underlying intermediate buffer layer 130 before the surface bonding layer 140 is deposited. The second conductive vias 131 may be formed by depositing a conductive material in the second openings. The conductive material may include, but is not limited to, aluminum, copper or tungsten. Preferably, the conductive material may comprise tungsten. Subsequent to the formation of the second conductive vias 131, the surface bonding layer 140 may be deposited on the second dielectric layer 132 so that the intermediate buffer layer 130 is electrically connected to the surface bonding layer 140 through the second conductive vias 131.

In one embodiment of the present invention, the plurality of first conductive vias 121 may include at least one row of first conductive vias 121 along each edge of the base metal layer 120. In other words, the first openings may be intentionally formed within the peripheral region of the base metal layer 120 but not in a central region of the base metal layer 120. The number of rows of first conductive vias 121 may range from three to five. That is, at least one row of first conductive vias 121 is formed near and along each edge of the base metal layer 120, and the row number of the first conductive vias 121 from the edge toward the central region may be three to five. In one embodiment of the present invention, the first conductive vias 121 may be arranged into a crisscross pattern (i.e., into rows and columns). Since the intermediate buffer layer 130 is aligned with the base metal layer 120, the relative positions of the first conductive vias 121 with respect to the intermediate buffer layer 130 are identical or similar to the relative positions of the first conductive vias 121 with respect to the base metal layer 120.

Similarly, in one embodiment of the present invention, the plurality of second conductive vias 131 may include at least one row of second conductive vias 131 along each edge of the intermediate buffer layer 130. In other words, the second openings may be intentionally formed within the peripheral region of the intermediate buffer layer 130 but not in a central region of the intermediate buffer layer 130. The number of rows of second conductive vias 131 may range from three to five. That is, at least one row of second conductive vias 131 is formed near and along each edge of the intermediate buffer layer 130, and the row number of the second conductive vias 131 from the edge toward the central region may be three to five. In one embodiment of the present invention, the second conductive vias 131 may be arranged into a crisscross pattern (i.e., into rows and columns). Since the surface bonding layer 140 is aligned with the intermediate buffer layer 130, the relative positions of the second conductive vias 131 with respect to the surface bonding layer 140 are identical or similar to the relative positions of the second conductive vias 131 with respect to the intermediate buffer layer 130.

Since there is no conductive vias on the central region of the intermediate buffer layer 130 and/or on the central region of the surface bonding layer 140, when the surface bonding layer 140 is stressed during bonding process, the intermediate buffer layer 130 and/or the surface bonding layer 140 may deform toward the central regions due to the absence of "rigid" support from conductive vias on the central regions, and the bonding stress can be better released.

In one embodiment of the present invention, the central region of the intermediate buffer layer 130 may be a hollow region 133, and the peripheral region of the intermediate buffer layer 130 may be a mesh structure. Additionally, the plurality of first conductive vias 121 and the plurality of second conductive vias 131 are not vertically aligned with a central region of the intermediate buffer layer, which means the first conductive vias 121 and the second conductive vias 131 are in regions vertically projecting an area of the intermediate buffer layer 130 that is out of the central region thereof. In other words, the top and bottom junctions of the first conductive vias 121 and top and bottom junctions of the second conductive vias 131 are not located within the regions vertically projecting the central region of the intermediate buffer layer 130 on the overlying and underlying layers thereof. The hollow region 133 may have any of various suitable shapes including, but not limited to, one or combination of triangular shape, rhombic shape, rectangular shape, circular shape, elliptic shape and hexagonal shape. In one embodiment of the present invention, the central region, i.e., the hollow region 133, may occupy 20% to 60% of the total area of the intermediate buffer layer 130.

The hollow central region of the intermediate buffer layer 130, i.e., the hollow region 133, can facilitate the deformation of the intermediate buffer layer 130 toward the central region when the surface bonding layer 140 is stressed during bonding, which can help release the stress. In addition, the mesh structure is also helpful in stress relief during bonding.

The mesh structure may have slots 150 that may have any of various suitable shapes including, but not limited to, one or combination of triangular shape, rhombic shape, rectangular shape, circular shape, elliptic shape and hexagonal shape. In a preferred embodiment of the present invention, the slots 150 may be rectangular and each of the slots 150 has a length/width ratio of 3-10.

In one embodiment of the present invention, the surface bonding layer 140 may be meshed at least in a peripheral region. In one example, the peripheral region of the surface bonding layer 140 may be a mesh structure. In another example, the entire surface bonding layer 140 may be a mesh structure. The mesh structure may have slots 150 with any of various suitable shapes including, but not limited to, one or combination of triangular shape, rhombic shape, rectangular shape, circular shape, elliptic shape and hexagonal shape. In a preferred embodiment of the present invention, the slots 150 may be rectangular and have a length/width ratio of 3-10.

Figure 2A:
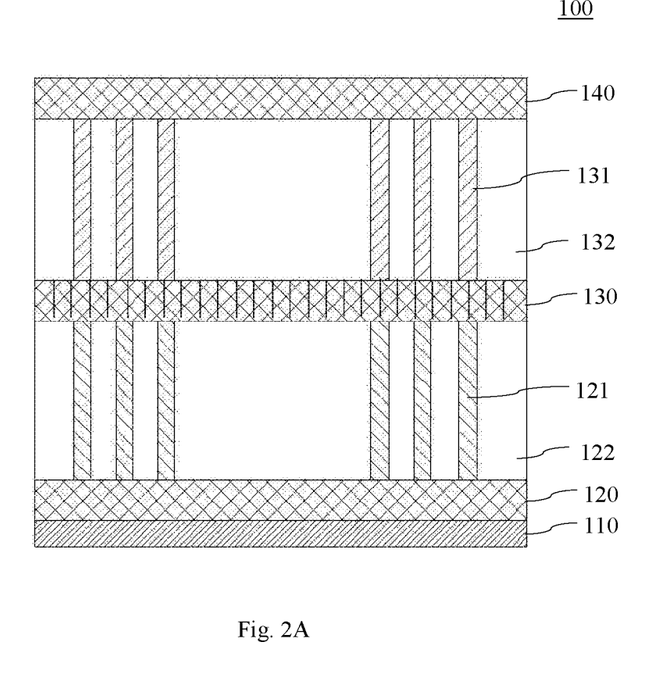
FIG. 2A is a schematic of a cross-sectional view of a bonding pad structure for a memory device according to some other embodiments of the present invention.
Figure 2B:
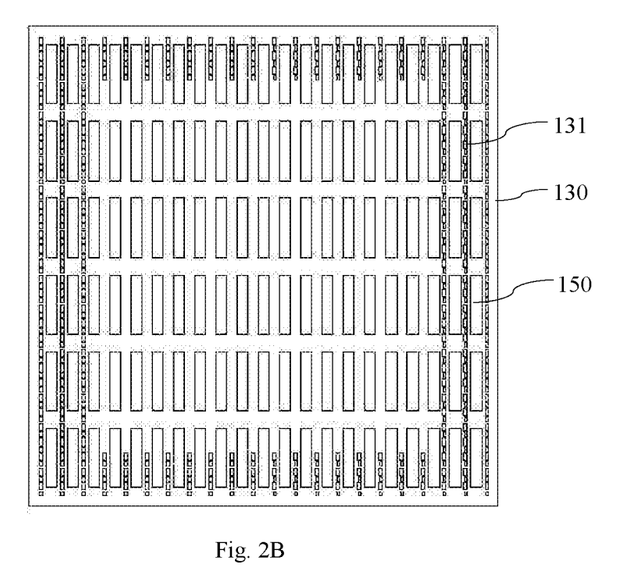
FIG. 2B is a schematic of a top view of the intermediate buffer layer in the bonding pad structure of FIG. 2A.
Figure 2C:
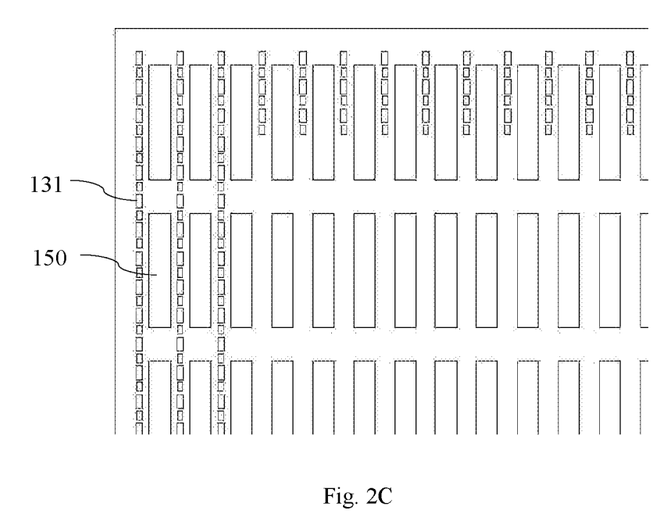
FIG. 2C shows an enlarged view of a portion of the intermediate buffer layer of FIG. 2B.

FIG. 2A is a schematic of a cross-sectional view of a bonding pad structure for a memory device according to some other embodiments of the present invention. FIG. 1B is a schematic of a top view of the intermediate buffer layer in the bonding pad structure of FIG. 2A. FIG. 2C shows an enlarged view of a portion of the intermediate buffer layer of FIG. 1B. A person skilled in the art will appreciate that the graphic representations shown in FIGS. 2A to 2C are merely illustrative without being necessarily drawn to full scale and do not limit the bonding pad structure according to the embodiment of the present invention in any way. The bonding pad structure 100 shown in FIGS. 2A to 2C is essentially identical to that of FIGS. 1A to 1C, except that the intermediate buffer layer 130 does not have a hollow region. Additionally, the intermediate buffer layer 130 may be meshed at least in the peripheral region. In one example, the peripheral region of the intermediate buffer layer 130 may be a mesh structure. In another example, the entire intermediate buffer layer 130 may be a mesh structure, as shown in FIGS. 2A to 2C. In this case, when the surface bonding layer 140 is stressed during bonding, the mesh structure can help relieve the stress. The mesh structure may have slots 150 with any of various suitable shapes including, but not limited to, one or combination of triangular shape, rhombic shape, rectangular shape, circular shape, elliptic shape and hexagonal shape. In a preferred embodiment of the present invention, the slots 150 may be rectangular and have a length/width ratio of 3-10.

In one embodiment of the present invention, the surface bonding layer 140 may be meshed at least in the peripheral region. In one example, the peripheral region of the surface bonding layer 140 may be a mesh structure. In another example, the entire surface bonding layer 140 may be a mesh structure. The mesh structure may have slots 150 with any of various suitable shapes including, but not limited to, one or combination of triangular shape, rhombic shape, rectangular shape, circular shape, elliptic shape and hexagonal shape. In a preferred embodiment of the present invention, the slots 150 may be rectangular and have a length/width ratio of 3-10.

Although only structures with three conductive layers (i.e., the base metal layer 120, the intermediate buffer layer 130 and the surface bonding layer 140) have been described and illustrated above, it is to be understood that structures with other numbers of conductive layers, for example, four layers, five layers, six layers, etc., are also possible. In addition, in order to highlight the inventive concept of the present invention, other typical components and structures that can be found in memory devices, as well as corresponding steps in their fabrication, are not described and illustrated herein.

The bonding pad structure 100 according to the foregoing embodiments of the present invention may be suitable for use in a memory device. Examples of the memory device may include static random access memory (SRAM) and dynamic random access memory (DRAM) devices.

In one embodiment of the present invention, there is provided a memory including the bonding pad structure 100 as defined above.

Figure 3:
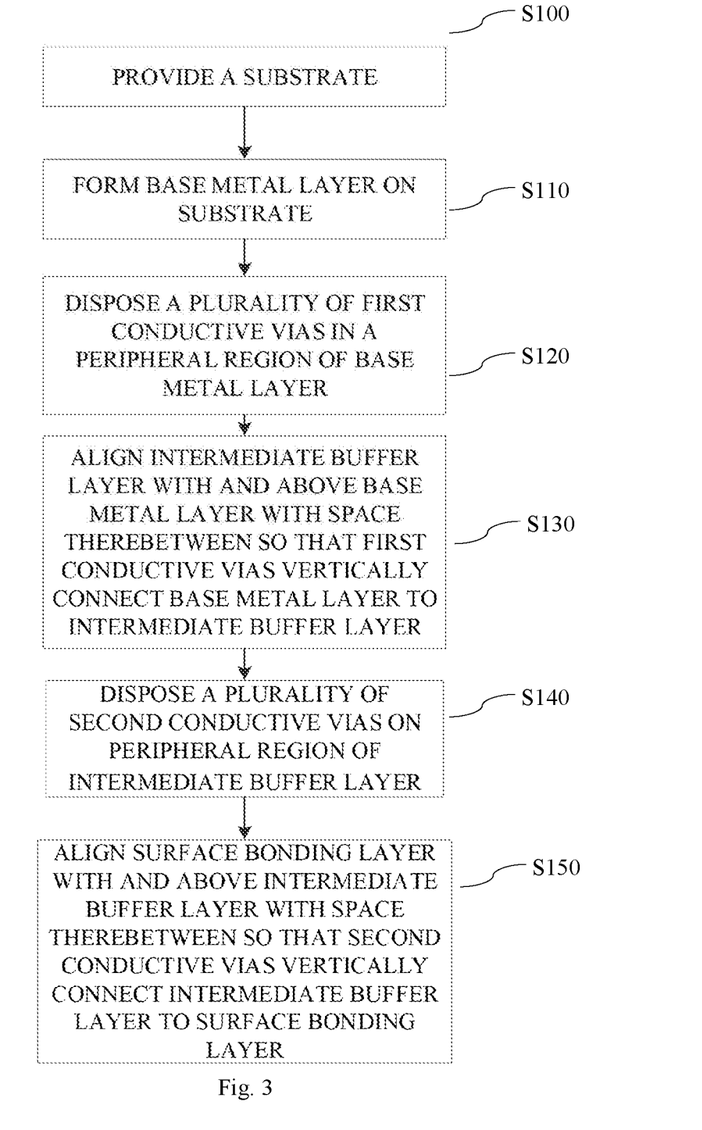
FIG. 3 is a flowchart of a method of manufacturing a bonding pad structure for a memory device according to some embodiments of the present invention.

FIG. 3 is a flowchart of a method for making a bonding pad structure in a memory device according to some embodiments of the present invention. Referring to FIG. 3, the method may include the steps detailed below.

In step S100, a substrate is provided.

In step S110, a base metal layer is formed on the substrate. The base metal layer may be formed by depositing a metal on the substrate. Techniques that can be used to deposit the metal may include, but are not limited to, vacuum evaporation, sputter deposition or chemical vapor deposition (CVD).

In step S120, a plurality of first conductive vias are arranged in a peripheral region of the base metal layer.

Specifically, a first dielectric layer may be formed (e.g., deposited) on the base metal layer, followed by the formation of a plurality of first openings therein using photolithography and etching processes. A conductive material (e.g., tungsten) may be deposited in the first openings to form the first conductive vias.

In one embodiment of the present invention, the plurality of first conductive vias may include at least one row of first conductive vias along each edge of the base metal layer. In other words, the first openings may be intentionally formed within the peripheral region of the base metal layer but not in a central region thereof. The number of rows of first conductive vias may be three to five. That is, the number of the at least one row of first conductive vias formed near and along each edge of the base metal layer may be three to five. In one embodiment of the present invention, the first conductive vias may be arranged into a crisscross pattern (i.e., into rows and columns).

In step S130, an intermediate buffer layer is disposed above the base metal layer, wherein the intermediate buffer layer is spaced from and aligned with the base metal layer, and the plurality of first conductive vias vertically connects the base metal layer and the intermediate buffer layer.

In particular, the intermediate buffer layer may be formed (e.g., deposited) on the first dielectric layer. The intermediate buffer layer is spaced from and aligned with the base metal layer. The alignment of the intermediate buffer layer with the base metal layer may be accomplished by patterning during the deposition of the metallic material on the first dielectric layer. Because the intermediate buffer layer is aligned with the base metal layer, a relative position between the first conductive vias and the intermediate buffer layer is identical or similar to a relative position between the first conductive vias and the base metal layer.

In step S140, a plurality of second conductive vias is arranged in a peripheral region of the intermediate buffer layer.

In particular, a second dielectric layer may be formed (e.g., deposited) on the intermediate buffer layer, followed by the formation of a plurality of second openings therein using photolithography and etching processes. A conductive material (e.g., tungsten) may be deposited in the second openings to form the second conductive vias.

In one embodiment of the present invention, the plurality of second conductive vias may include at least one row of second conductive vias along each edge of the intermediate buffer layer. In other words, the second openings may be intentionally formed within the peripheral region of the intermediate buffer layer but not in a central region thereof.

The number of rows of second conductive vias may be three to five. That is, the number of the at least one row of second conductive vias formed near and along each edge of the intermediate buffer layer may be three to five. In one embodiment of the present invention, the second conductive vias may be arranged into a crisscross pattern (i.e., into rows and columns).

In step S150, a surface bonding layer is disposed above the intermediate buffer layer, wherein the surface bonding layer is spaced from and aligned with the intermediate buffer layer, and the plurality of second conductive vias vertically connects the intermediate buffer layer and the surface bonding layer.

In particular, the surface bonding layer may be formed (e.g., deposited) on the second dielectric layer. The surface bonding layer is spaced from and aligned with the intermediate buffer layer. The alignment of the surface bonding layer with the intermediate buffer layer may be accomplished by patterning during the deposition of the metallic material on the second dielectric layer. Because the surface bonding layer is aligned with the intermediate buffer layer, a relative position between the second conductive vias and the surface bonding layer is identical or similar to a relative position between the second conductive vias and the intermediate buffer layer.

In one embodiment of the present invention, the intermediate buffer layer may be meshed at least in the peripheral region. The meshing may be accomplished, for example, by metal patterning. In one example, the peripheral region of the intermediate buffer layer may be a mesh structure. In another example, the entire intermediate buffer layer may be a mesh structure. The mesh structure may have slots with any of various suitable shapes including, but not limited to, one or combination of triangular shape, rhombic shape, rectangular shape, circular shape, elliptic shape and hexagonal shape. In a preferred embodiment of the present invention, the slots may be rectangular and have a length/width ratio of 3-10.

In one embodiment of the present invention, the surface bonding layer may be meshed at least in a peripheral region thereof. The meshing may be accomplished, for example, by metal patterning. In one example, the peripheral region of the surface bonding layer may be a mesh structure. In another example, the entire surface bonding layer may be a mesh structure. The mesh structure may have slots with any of various suitable shapes including, but not limited to, one or combination of triangular shape, rhombic shape, rectangular shape, circular shape, elliptic shape and hexagonal shape. In a preferred embodiment of the present invention, the slots may be rectangular and have a length/width ratio of 3-10.

In one embodiment of the present invention, the central region of the intermediate buffer layer may be a hollow region, and the peripheral region of the intermediate buffer layer may be a mesh structure. Additionally, the intermediate buffer layer comprises a mesh structure, and the plurality of first conductive vias and the plurality of second conductive vias not vertically aligned with a central region of the intermediate buffer layer, which means the first conductive vias and the second conductive vias are in regions vertically projecting an area of the intermediate buffer layer 130 that is out of the central region of intermediate buffer layer. In other words, the top and bottom junctions of the first conductive vias and top and bottom junctions of the second conductive vias are not located within the regions vertically projecting the central region of the intermediate buffer layer on the overlying and underlying layers thereof.

In one embodiment of the present invention, the central region, i.e., the hollow region, may occupy 20% to 60% of the total area of the intermediate buffer layer.

While only some principal steps of the method have been described in the foregoing embodiments, those skilled in the art will appreciate that the method may also include other conventionally known steps which are not described in detail herein for the sake of brevity and conciseness but should also be considered within the scope of the present invention.

Although a few preferred embodiments of the present invention have been described in detail above with reference to the accompanying drawings, the present invention is not limited to the details disclosed hereinabove. Various simple modifications may be made to the subject matter of the present invention within the spirit thereof. Accordingly, all such simple modifications are considered to also fall within the scope of the application.

It should be further noted that the various specific features described in the foregoing particular embodiments may be combined in any technically suitable manner without contradiction. Such various possible combinations will, however, not described herein in order to avoid unnecessary repetition.

Further, various embodiments of the present invention may also be combined in any manner without departing from the spirit thereof, and such combinations shall be considered as equally within the scope of this application.

The invention claimed is:

1. A bonding pad structure for a memory device, comprising:
   a base metal layer formed on a substrate;
   a plurality of first conductive vias arranged in a peripheral region of the base metal layer;
   an intermediate buffer layer formed above the base metal layer, wherein the intermediate buffer layer is spaced from and aligned with the base metal layer, and the plurality of first conductive vias is vertically connecting the base metal layer and the intermediate buffer layer;
   a plurality of second conductive vias arranged in a peripheral region of the intermediate buffer layer; and
   a surface bonding layer formed above the intermediate buffer layer, wherein the surface bonding layer is spaced from and aligned with the intermediate buffer layer, and the plurality of second conductive vias is vertically connecting the intermediate buffer layer and the surface bonding layer,
   wherein the intermediate buffer layer comprises a mesh structure, and the plurality of first conductive vias and the plurality of second conductive vias are not vertically aligned with a central region of the intermediate buffer layer,
   wherein the central region of the intermediate buffer layer comprises a hollow region, the mesh structure is formed in the peripheral region of the intermediate buffer layer, and the mesh structure in the peripheral region of the intermediate buffer layer comprises rectangular slots.

2. The bonding pad structure of claim 1, wherein each of the rectangular slots has a length/width ratio ranging from 3 to 10.

3. The bonding pad structure of claim 1, wherein the hollow region of the central region of the intermediate buffer layer occupies 20% to 60% of a total area of the intermediate buffer layer.

4. A bonding pad structure for a memory device, comprising:

a base metal layer formed on a substrate;

a plurality of first conductive vias arranged in a peripheral region of the base metal layer;

an intermediate buffer layer formed above the base metal layer, wherein the intermediate buffer layer is spaced from and aligned with the base metal layer, and the plurality of first conductive vias is vertically connecting the base metal layer and the intermediate buffer layer;

a plurality of second conductive vias arranged in a peripheral region of the intermediate buffer layer;

a surface bonding layer formed above the intermediate buffer layer, wherein the surface bonding layer is spaced from and aligned with the intermediate buffer layer, and the plurality of second conductive vias is vertically connecting the intermediate buffer layer and the surface bonding layer, wherein the intermediate buffer layer comprises a mesh structure, and the plurality of first conductive vias and the plurality of second conductive vias are not vertically aligned with a central region of the intermediate buffer layer;

a first dielectric layer between the base metal layer and the intermediate buffer layer, the first dielectric layer having a plurality of first openings formed therein, the plurality of first conductive vias formed in the plurality of first openings; and a second dielectric layer between the intermediate buffer layer and the surface bonding layer, the second dielectric layer having a plurality of second openings formed therein, the plurality of second conductive vias formed in the plurality of second openings.

5. The bonding pad structure of claim 1, wherein the plurality of first conductive vias comprises three to five rows of first conductive vias within the peripheral region of the base metal layer.

6. The bonding pad structure of claim 1, wherein the plurality of second conductive vias comprises three to five rows of second conductive vias within the peripheral region of the intermediate buffer layer.

7. A method of manufacturing a bonding pad structure for a memory device, comprising:

providing a substrate;

forming a base metal layer on the substrate;

arranging a plurality of first conductive vias in a peripheral region of the base metal layer;

disposing an intermediate buffer layer above the base metal layer, wherein the intermediate buffer layer is spaced from and aligned with the base metal layer, and the plurality of first conductive vias vertically connects the base metal layer and the intermediate buffer layer;

arranging a plurality of second conductive vias in a peripheral region of the intermediate buffer layer; and disposing a surface bonding layer above the intermediate buffer layer, wherein the surface bonding layer is spaced from and aligned with the intermediate buffer layer, and the plurality of second conductive vias vertically connects the intermediate buffer layer and the surface bonding layer, wherein the intermediate buffer layer comprises a mesh structure, and the plurality of first conductive vias and the plurality of second conductive vias not vertically aligned with a central region of the intermediate buffer layer.

8. The method of claim 7, wherein the central region of the intermediate buffer layer comprises a hollow region, and the mesh structure is formed in the peripheral region of the intermediate buffer layer.

9. The method of claim 8, wherein the mesh structure in the peripheral region of the intermediate buffer layer comprises rectangular slots.

10. The method of claim 9, wherein each of the rectangular slots has a length/width ratio ranging from 3 to 10.

11. The method of claim 9, wherein the hollow region of the central region of the intermediate buffer layer occupies 20% to 60% of a total area of the intermediate buffer layer.

12. The method of claim 7, further comprising:

forming a first dielectric layer between the base metal layer and the intermediate buffer layer;

forming a plurality of first openings in the first dielectric layer, in which the plurality of first conductive vias is formed;

forming a second dielectric layer between the intermediate buffer layer and the surface bonding layer; and forming a plurality of second openings in the second dielectric layer, in which the plurality of second conductive vias is formed.

13. The method of claim 7, wherein the plurality of first conductive vias comprises three to five rows of first conductive vias within the peripheral region of the base metal layer.

14. The method of claim 7, wherein the plurality of second conductive vias comprises three to five rows of second conductive vias within the peripheral region of the intermediate buffer layer.

* * * * *